United States Patent
Caubet et al.

(10) Patent No.: US 9,530,489 B2
(45) Date of Patent: Dec. 27, 2016

(54) OPTOELECTRONIC DEVICE, IN PARTICULAR MEMORY DEVICE

(71) Applicant: STMICROELECTRONICS (CROLLES 2) SAS, Crolles (FR)

(72) Inventors: Pierre Caubet, Le Versoud (FR); Mickael Gros-Jean, Grenoble (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 48 days.

(21) Appl. No.: 14/527,166

(22) Filed: Oct. 29, 2014

(65) Prior Publication Data

US 2015/0117128 A1   Apr. 30, 2015

(30) Foreign Application Priority Data

Oct. 30, 2013 (FR) .................... 13 60620

(51) Int. Cl.
  *G11C 7/00* (2006.01)
  *G11C 11/42* (2006.01)
  *G11C 13/04* (2006.01)
  *G02F 1/163* (2006.01)
  *G02F 1/15* (2006.01)
  *G02F 3/02* (2006.01)

(52) U.S. Cl.
  CPC ............. *G11C 11/42* (2013.01); *G02F 1/1523* (2013.01); *G02F 1/163* (2013.01); *G11C 13/04* (2013.01); *G02F 1/1525* (2013.01); *G02F 1/1527* (2013.01); *G02F 3/022* (2013.01); *G02F 2001/1635* (2013.01); *G02F 2201/58* (2013.01); *G11C 7/00* (2013.01)

(58) Field of Classification Search
  CPC ......... G11C 13/04; G11B 7/0033; G11B 7/24; G11B 7/0045; G11B 7/0938

USPC ......................................... 365/215, 106, 148
See application file for complete search history.

(56) References Cited

U.S. PATENT DOCUMENTS

| | | |
|---|---|---|
| 4,054,890 A | 10/1977 | Shimomura |
| 4,256,372 A | 3/1981 | Yasukuni et al. |
| 4,354,754 A | 10/1982 | Takahashi et al. |

(Continued)

FOREIGN PATENT DOCUMENTS

| | | |
|---|---|---|
| FR | 2746934 A1 | 10/1997 |
| JP | 2007244192 A | 9/2007 |
| JP | 2009076670 A | 4/2009 |

OTHER PUBLICATIONS

Sato et al., "Ultra-Multilayered Optical Recording Using Electrochromic Material," Science & Technical Research Laboratories, Japan Broadcasting Corporation (NHK), Aug. 25, 2004, 6 pages.

*Primary Examiner* — Jason Lappas
(74) *Attorney, Agent, or Firm* — Allen, Dyer, Doppelt, Milbrath & Gilchrist, P.A.

(57) ABSTRACT

A memory device may include an access transistor, and a memory cell configured to store an item of information. The memory cell may include first and second electrodes configured to have different optoelectronic states corresponding respectively to two values of the item of information, and to switch between the different optoelectronic states based upon a control signal external to the memory cell, the different optoelectronic states being naturally stable in an absence of the control signal. The memory cell may also include a solid electrolyte between the first and second electrodes.

29 Claims, 3 Drawing Sheets

(56) References Cited

U.S. PATENT DOCUMENTS

| | | | |
|---|---|---|---|
| 4,498,156 A | 2/1985 | Pizzarello | |
| 6,861,014 B2 | 3/2005 | Fitzmaurice et al. | |
| 6,867,894 B2 | 3/2005 | Asano et al. | |
| 6,870,657 B1 | 3/2005 | Fitzmaurice et al. | |
| 8,542,518 B2 * | 9/2013 | Bratkovski | G11C 13/0007 365/106 |
| 2008/0212160 A1 | 9/2008 | Fanton et al. | |
| 2009/0225022 A1 | 9/2009 | Tolbert | |
| 2014/0003125 A1 * | 1/2014 | Koushan | G11C 13/0002 365/148 |

* cited by examiner

OPTOELECTRONIC DEVICE, IN PARTICULAR MEMORY DEVICE

TECHNICAL FIELD

The present disclosure relates to optoelectronic devices and, more particularly, to an optoelectronic cell for a nonvolatile optoelectronic memory device or an optoelectronic device with variable resistance.

BACKGROUND

The types of memory include volatile memories, which lose their information if their electricity supply is cut, and nonvolatile memories, which keep the information in the event of a power loss. Volatile memories include dynamic random-access memories (DRAMs), and static random-access memories (SRAMs).

A DRAM dynamic memory cell comprises an access transistor and a storage capacitor. Because of the existence of a leakage current in the insulator, the capacitor of the DRAM memory finally discharges, leading to a decrease in its voltage, and at the end of a few milliseconds the stored charge is almost entirely lost.

In order to avoid information losses in a DRAM, it is consequently necessary to recharge the capacitor so as to refresh the memory cell. An SRAM static memory cell comprises a bistable formed by two cross-coupled inverters and storing the datum, as well as two access transistors. SRAM memories do not need to be refreshed in order to keep the datum, but occupy more space than DRAM memories. For nonvolatile memories, EEPROM memories (Electrically Erasable and Programmable Read-Only Memory) may be mentioned.

SUMMARY

Generally speaking, a memory device may include an access transistor, and a memory cell coupled to the access transistor configured to store an item of information. The memory cell may include first and second electrodes configured to have different optoelectronic states corresponding respectively to two values of the item of information, and to switch between the different optoelectronic states based upon a control signal external to the memory cell, the different optoelectronic states being naturally stable in an absence of the control signal. The memory cell may also include a solid electrolyte between the first and second electrodes.

DETAILED DESCRIPTION

Figure 1:
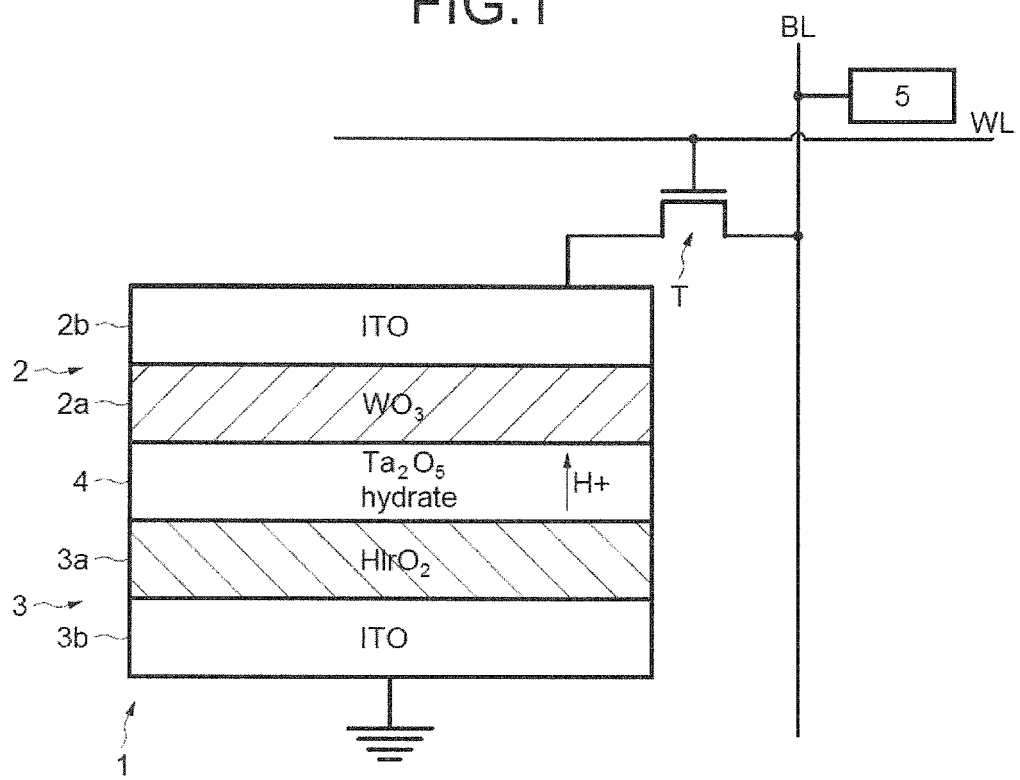
FIG. 1 is a schematic diagram of a memory device according to one embodiment of the present disclosure.

According to one embodiment, a nonvolatile memory device is provided, the size of which is as small as a DRAM and the storage capacity of which is as great as a DRAM. According to another embodiment, a memory device is further provided, which has a better response time and a better access time compared in particular with other types of memory such as oxide-based RAMs (OXRAM) or conductive bridging RAMs (CBRAMs). According to one embodiment, a memory device is also provided, which withstands high manufacturing and operating temperatures and can be inserted anywhere into an integrated circuit. According to another embodiment, a memory device is also provided, which offers better long-term endurance by virtue of the use of different physical principles for writing to the memory and for reading therefrom.

According to another aspect, an optoelectronic device with variable impedance is also provided. According to a first aspect, a memory device is provided, comprising at least one memory cell having an access transistor and a means or a memory cell for storing information. The memory cell comprises two electrodes configured to have at least two different optoelectronic states corresponding respectively to at least two values of the item of information, and to change from one optoelectronic state to another in the presence of a control signal external to the memory cell, the optoelectronic states being naturally stable in the absence of a control signal, and a solid electrolyte contained between the two electrodes.

The memory cell is constructed on the same principle as a DRAM with an equivalent storage capacity, while offering the memory a nonvolatile nature. The access transistor makes it possible to access the memory cell in order to allow an optoelectronic state change thereof, and more particularly of the electrodes, in order to write or erase items of information in the memory cell. Of course, depending on the intensity of the control signal and/or the duration for which it is applied, more than two optoelectronic states may be defined for the memory cell, so as to define more than two values for the item of information stored.

According to one embodiment, the memory cell comprises two electrochromic electrodes separated by an electrolyte used as an insulator. The state of the memory cell, and in particular the state of the electrodes, changes only when a redox reaction has taken place. The redox reaction can take place only in the presence of an electric field between the two electrodes, so that the items of information stored in the storage means of the memory cell are maintained there when there is a cut in the supply of the memory device.

Furthermore, the memory cell has no need for a refresh in order to keep the items of information in memory. Preferably, the two electrodes each comprise a bilayer having a layer of electrochromic material and a layer of conductive material. An electrochromic material is capable of reversibly inserting cations such as $H^+$, $Li^+$, $K^+$, $Na^+$ or $Ag^+$ and electrons. Their color, and therefore their opacity, changes depending on whether cations are absorbed or desorbed following a change in redox state of the metal centers. Various electrochromic materials may be used, such as: metal oxides such as $WO_3$, $V_2O_5$, $NiO_x$ or $IrO_2$, metal complexes such as cyanometalates, such as Prussian blue, polymers used as electronic conductors, or organic compounds such as viologen.

The conductive material makes it possible to apply an electrical potential to the electrode and thus, in combination with the other electrode, to generate an electric field between the two electrodes. The electrochromic material makes it possible to modify the color and the opacity of the electrode in the presence of an electric field on the basis of a redox reaction.

Preferably, one electrode comprises a bilayer having a cathodic electrochromic material, and the other electrode comprises a bilayer having an anodic electrochromic material, the cathodic and anodic electrochromic materials reacting to protons H+. The cathodic electrochromic material may be tungsten trioxide $WO_3$, with a thickness of from 30 to 5000 Å. The tungsten trioxide $WO_3$ is deposited in its hydride form $HWO_3$. The anodic electrochromic material may be iridium dioxide $IrO_2$, with a thickness of from 30 to 5000 Å.

The use of $H^+$ for the redox makes it possible to accelerate the response time of the memory cell, and therefore its access time. This is because protons $H^+$ are the smallest charge carriers, and their mobility is ideal for gaining processing speed in the memory device, in particular compared with other types of memory such as OXRAMs using oxygen vacancies, or CBRAMs using silver or copper atoms, which are larger than protons and the transfer of which is consequently slower.

Advantageously, the electrolyte comprises a layer of $Ta_2O_5$ hydrate. $Ta_2O_5$ hydrate is a thermally very stable material. Furthermore, since the material is deposited at a temperature of 420° C., which is higher than all the temperatures of the processes for producing metal interconnection levels of the integrated circuit (BEOL: Back End Of Line), the manufacture of an integrated circuit comprising such a memory device will not degrade the electrolyte.

The use of $Ta_2O_5$ hydrate as an electrolyte, that is to say as an insulator, thus allows the memory cell to withstand high manufacturing and operating temperatures, and makes it possible to insert the memory device anywhere in an integrated circuit, for example. The thickness of the solid electrolyte used depends on the voltage desired so that the electrochromic material of each electrode of the memory cell changes from a colored state to an uncolored or transparent state, that is to say from a first opacity state to a second opacity state different from the first state, or from a first coloration or opacity state to another coloration or opacity state, the electrodes of the memory cell comprising a plurality of coloration states.

The layer of $Ta_2O_5$ hydrate may advantageously have a thickness of between 30 Å and 2000 Å. For example, a thickness of 300 Å of a layer of $Ta_2O_5$ hydrate corresponds to a transition voltage of the cell of between about 1 and 5 V. The $H^+$ cation conductivity is controlled by the hydration of the film of $Ta_2O_5$, which is itself controlled by the porosity of the film and the method by which it is immersed in an aqueous solution. Preferably, the memory device comprises first means or circuit capable of generating an electric field between the two electrodes in order to modify the optoelectronic state of the electrodes.

When an electric field is applied between the anode and the cathode, the uncolored anode is oxidized by a losing a proton H+ according to the redox reaction. The loss of the proton H+ leads to a state change of the anodic electrode, causing coloration of the electrode, that is to say an increase in the opacity of the anodic electrochromic material of the electrode, and a variation in the impedance of the anodic electrode compared with the initial impedance of the anode when the anode was uncolored.

In the absence of voltages applied between the anode and the cathode, a redox reaction is no longer possible in the structure of the memory cell. It is therefore not necessary to maintain a voltage in order to keep the coloration, and therefore the opacity, of the structure. In order to erase the memory cell, the colored form is returned to the transparent form by applying an electric field opposite to the previous one.

The electrodes of the memory cell thus return from a colored, that is to say opaque, state to the uncolored i.e. transparent state, and the materials of the electrodes return to their initial resistivity and their initial impedance value. Advantageously, the memory device may comprise electrical reading means or circuit capable of measuring the impedance of at least one electrode.

Once the writing or erasing electric field is stopped, the electrodes of the memory cell are electrically neutral and keep their optical state, which is more or less opaque or colored or transparent, and their impedance. The solid electrolyte insulates the anodic and cathodic electrochromic materials perfectly. Consequently, no redox reaction can take place. The memory cell is electrically stable.

The memory cell may be read electrically by measuring the impedance, and in particular the resistance, of one of the two electrodes, given that the redox reaction leads to a modification of the impedance and, in particular, to a modification of the resistivity of the electrochromic materials of each of the electrodes. The electrochromic memory cell does not have an electric charge to be read, in contrast to the electrical capacitance of a DRAM. Thus, in contrast to a DRAM memory, which is discharged by the electrical reading, the electrical reading of the memory cell does not modify its electrical state since only an electric field between the anode and the cathode can modify the state of the memory cell.

The reading means may, for example, comprise a voltage divider arrangement having an impedance, and in particular a resistance, which is known. By using one of the two electrodes as a gauge resistor mounted in series with a known resistance, the application of a known voltage makes it possible to determine the value of the resistance of the measured electrode of the memory cell.

The memory device may also comprise optical writing means or a circuit capable of emitting a light beam and measuring the light beam reflected by the memory cell. The optical reading means may comprise a module for emitting a light beam, such as a light-emitting diode or a laser diode, and a photovoltaic sensor, such as a photodiode, the emission module and the photovoltaic sensor being arranged facing the same electrode of the memory cell.

In this embodiment, the layer of conductive material of the electrode exposed to the light beam is preferably transparent. In this embodiment, the reading comprises a measurement of the amount of light reflected by at least one electrode of the memory cell, the measurement corresponding to the state of coloration, or opacity, of the electrode on which an emitted light beam is reflected. With the layer of electrochromic material of an electrode being arranged between the layer of conductive material and the solid electrolyte, the transparency of the layer of conductive material makes it possible to ensure that the amount of light reflected by the electrode, the state of coloration or opacity of which is being measured, corresponds well mainly to the amount of light reflected by the layer of electrochromic material of the electrode.

In this embodiment, and if the memory cell is configured in order to have only two binary states, the low state of binary value 0 is detected when the amount of light measured by the photovoltaic sensor is zero or small, that is to say less than a detection threshold, and the high state of binary value 1 is detected when the amount of light measured by the photovoltaic sensor is nonzero or large, that is to say greater than the detection threshold. In another embodiment, the memory device may advantageously comprise optical reading means or a circuit capable of emitting a light beam and measuring the light beam transmitted by the memory cell. The optical reading means may comprise a module for emitting a light beam, such as a light-emitting diode or a laser diode, facing one electrode, and a photovoltaic sensor, such as a photodiode, facing the other electrode, so that the emission module and the photovoltaic sensor are arranged on either side of the memory cell in relation to the stack.

Preferably, in this other embodiment, the layer of conductive material of each electrode of the memory cell is transparent and the solid electrolyte is transparent. In this other embodiment, the reading comprises a measurement of the amount of light transmitted by the memory cell, that is to say the amount of light which has passed through the memory cell. The measurement corresponds to the state of coloration, or opacity, of the electrodes through which an incident light beam has propagated. With the measurement corresponding to the amount of light transmitted by the memory cell, the transparency of the layer of conductive material of each electrode makes it possible to ensure that the amount of light not transmitted by the memory cell corresponds well to the amount of light reflected by the layers of electrochromic material of the electrodes.

In this other embodiment, and if the memory cell is configured in order to have only two binary states, the high state of binary value 1 is detected when the amount of light measured by the photovoltaic sensor is zero or small, that is to say less than a detection threshold, and the low state of binary value 0 is detected when the amount of light measured by the photovoltaic sensor is nonzero or large, that is to say greater than the detection threshold. By using a reading mode different from the electrical writing mode, such as an optical reading mode, the memory device offers better endurance and better long-term retention. The endurance is the lifetime of a memory expressed as a total number of writing/erasing cycles. The retention is the duration for which the stored information is kept. Depending on the types of memory, the use of the same physical principle for the reading and the writing (opposite of the erasing) reduces the endurance and the retention.

Preferably, the layer of transparent conductive material comprises a metal oxide or a thin layer of metal, the layer of transparent material having a thickness of between 30 Å and 1000 Å. A metal oxide or metal layer thickness of less than 1000 Å makes it possible to keep good light transparency and minimize the amount of light absorbed or reflected by the layer of conductive material, while allowing the application of a uniform potential over the entire layer, and thus the generation of an electric field distributed uniformly over the entire surface of the electrode.

According to another aspect, an integrated circuit comprising a memory device as defined above is provided. According to yet another aspect, an optoelectronic device with variable impedance is provided, comprising a cell having two electrodes configured in order to have a plurality of different optoelectronic states corresponding respectively to different impedances of the electrodes, a solid electrolyte contained between the two electrodes, a control input for receiving a control signal intended to put the electrodes in a given state, and connection terminals intended to be coupled to an electrical circuit.

The principle of varying the impedance of the electrodes by a redox reaction of the electrochromic layers of the electrodes can be used to produce a variable impedance, in particular a variable resistance, whose value is controlled by the proportion of electrochromic material which is converted from the oxidized form having a high resistivity to the reduced form which has a low resistivity.

The use of a variable impedance, in particular a resistance, in a circuit, in particular an integrated circuit, makes it possible inter alia to control the speed of rotation of an electric motor. It may also be used to adjust the RC time constant of a circuit, or to produce a lowpass or highpass filter whose cut-off frequency can be selected. The filters are circuits of the series RC type, transmitting certain frequencies while attenuating others or reducing their amplitude. The cut-off frequency is the frequency beyond which the filter limits passage of the input signal. It can be selected by appropriately setting the value of the resistance and/or of the capacitance of the capacitor. By controlling the conversion of material during the redox reaction of the electrochromic material, it is possible to alter the resistance of a gauge electrode. The rest of the cell constitutes the device for adjusting the value of impedance, in particular resistance.

Preferably, the two electrodes each comprise a bilayer comprising a layer of electrochromic material and a layer of conductive material, which is preferably transparent. Preferably, one electrode comprises a bilayer having a cathodic electrochromic material, and the other electrode comprises a bilayer having an anodic electrochromic material. Advantageously, the electrolyte may comprise a layer of $Ta_2O_3$ hydrate.

The layer of $Ta_2O_3$ hydrate may have a thickness of between 30 Å and 2000 Å. Advantageously, the optoelectronic device may comprise control means or a controller capable of generating an electric field between the two electrodes in order to modify the optoelectronic state of the electrodes and thus modify their impedance.

According to another aspect, an integrated circuit comprising an optoelectronic device with variable impedance as defined above is provided. The memory device according to an embodiment comprises a memory plane having a plurality of memory cells arranged in rows and columns.

In FIG. 1, in order to simplify the drawing, a single memory cell is represented. The memory cell device comprises a storage means or an individual memory cell 1 having a cathodic electrode 2, an anodic electrode 3, and a solid electrolyte 4 located between the two electrodes 2 and 3. Here, the electrodes 2 and 3 are both configured so that they each have two different binary optoelectronic states, corresponding respectively to two binary values (0, 1) of an item of information to be stored in the memory cell. The cathodic electrode 2 comprises a bilayer having a layer of cathodic electrochromic material 2a comprising, in this example illustrated, tungsten trioxide $WO_3$ and a layer of transparent conductive material 2b having an ITO, standing for Indium Tin Oxide, which may for example be $In_2O_3$:Sn or $In_2O_3$—$SnO_2$.

The layer of cathodic electrochromic material 2a containing tungsten trioxide $WO_3$ has a thickness of between 30 and 5000 Å. The tungsten trioxide $WO_3$ is deposited in the hydride form $HWO_3$ by PVD (standing for Physical Vapor Deposition) of a tungsten or tungsten oxide target with a plasma of argon Ar and water $H_2O$ or argon with dihydrogen $H_2$ and dioxygen $O_2$. Tungsten trioxide $WO_3$ may also be obtained by CVD deposition (standing for Chemical Vapor Deposition) of a source of tungsten W, such as $WF_6$, and a plasma of water $H_2O$ or a plasma of dioxygen $O_2$ and dihydrogen $H_2$. Tungsten trioxide hydride $HWO_3$ may also be obtained by treatment with a plasma of water $H_2O$ or of dioxygen $O_2$ and dihydrogen $H_2$ after deposition of Tungsten W.

The anodic electrode 3 comprises a bilayer having a layer of anodic electrochromic material 3a comprising, in this example illustrated, iridium dioxide hydride $HIrO_2$ and a layer of transparent conductive material 2b, also containing an ITO. The layer of anodic electrochromic material 3a containing iridium dioxide hydride $HIrO_2$ has a thickness of from 30 to 5000 Å. The iridium dioxide $IrO_2$ may be deposited by reactive sputtering with argon and dioxygen $Ar+O_2$ of an iridium Ir target or by simple argon sputtering of an iridium oxide target. The layer of conductive material 2b of the cathode 2 has a thickness of between 30 and 1000 Å.

The ITO of the layer of conductive material 2b and 3b of each electrode 2 and 3 may be deposited by reactive oxygen sputtering of an indium-tin target or by simple sputtering of an indium tin oxide target. The ITO of the layer of conductive material 2b and 3b of the two electrodes 2 and 3 may be replaced with ruthenium oxide, a suboxide of titanium $TiO_x$, a thin layer of titanium nitride TiN, a suboxide of titanium nitride $TiNO_x$, silver oxide $Ag_2O$, zinc oxide ZnO, or $V_2O_5$.

In this embodiment, the layer of conductive material 3b of the anode may have any thickness. Preferably, however, in order to obtain a uniform electric field and symmetrical reversible operation of the cell, the thickness of the layer of conductive material 3b of the anode 3 is the same as the thickness of the layer of conductive material 2b of the cathode 2. The materials selected for the layer of cathodic electrochromic material 2a, tungsten trioxide $WO_3$, and the layer of anodic electrochromic material 3a, iridium dioxide hydride $HIrO_2$, react with protons $H^+$. In fact, tungsten trioxide $WO_3$ is uncolored, whereas it is blue in its hydride form $HWO_3$, and iridium dioxide is yellow, whereas it is transparent in its hydride form $HIrO_2$.

The electrolyte 4 comprises a layer of $Ta_2O_5$ hydrate, which preferably offers great resistance to high temperatures for the memory cell. The layer of $Ta_2O_5$ hydrate has a thickness of 300 Å in this example illustrated in FIG. 1, so that the state transition voltage of the electrodes 2 and 3 corresponds to a voltage of between about 1 and 5 V.

In order to write an item of information into the storage means 1 of the memory cell and erase the content of the storage means 1, a potential difference is applied between the two electrodes 2 and 3 in order to generate an electric field between the two electrodes 2 and 3 so as to modify the optoelectronic state of the electrodes.

In one exemplary embodiment, the gate of an access transistor T of the memory cell may be coupled to a control line WL, referred to as a "word line," controlling the access to the storage means of the memory cell, whereas the drain of the access transistor T is coupled to the layer of conductive material of one of the electrodes, the layer of conductive material of the other electrode being grounded, and the source of the transistor is coupled to a potential line BL, referred to as a "bit line," allowing voltage generation means or circuit 5 to apply a positive or negative potential in order to generate the electric field between the two electrodes and thus allow writing or erasing of an item of information on the storage means of the memory cell, when the access transistor enables access to the storage means.

In the example illustrated in FIG. 1, when an electric field is applied between the anode and the cathode, the anode 3 of iridium dioxide hydride $HIrO_2$, which is uncolored, is oxidized into yellow-colored iridium dioxide $IrO_2$ by losing a proton $H^+$ according to the reaction:

$$H_xIrO_2 \rightarrow xH^+ + xe^- + IrO_2. \tag{1}$$

The proton $H^+$ lost by the anode migrates towards the cathode 2 through the solid electrolyte 4 of $Ta_2O_5$ hydrate. At the same time, anions $OH^-$ present in the $Ta_2O_5$ hydrate move in the opposite direction. Then, at the cathode 2, the proton $H^+$ reduces the uncolored tungsten oxide $WO_3$ into blue-colored tungsten trioxide hydride HWO3 according to the reaction:

$$WO_1 + xH^+ + xe^- \rightarrow H_xWO_3. \tag{2}$$

In the absence of voltages applied between the anode 3 and the cathode 2, a redox reaction is no longer possible in the structure of the storage means 1 of the memory cell. It is therefore not necessary to maintain a voltage in order to keep the coloration, and therefore the opacity, of the structure. In order to erase the memory cell, the colored form is returned from to the transparent form by applying an electric field opposite to the previous one.

In the example illustrated in FIG. 1, during the application of an electric field configured to erase the storage means 1 of the memory cell, the cathode 2 comprising blue-colored tungsten trioxide hydride $HWO_3$ loses its proton $H^+$ while being oxidized into uncolored, that is to say transparent, tungsten trioxide WO3, according to the reaction:

$$H_xWO_3 \rightarrow xH^+ + xe^- + WO_3. \tag{3}$$

In parallel, during the application of the same electric field, the anode 3 comprising yellow-colored iridium dioxide $IrO_2$ is reduced into uncolored, that is to say transparent, iridium dioxide hydride $HIrO_2$ by recovering the proton $H^+$ according to the reaction:

$$IrO_2 + xH^+ + xe^- \rightarrow H_xIrO_2. \tag{4}$$

The storage means 1 of the memory cell thus returns from the colored, that is to say opaque, state to the uncolored i.e. transparent state, and the materials of the electrodes 2 and 3 return to their initial resistivity. The electrochromic electrodes 2 and 3 of the storage means 1 of the memory cell being separated by an electrolyte 4 as an insulator, the state of the memory changes only when a redox reaction takes place, that is to say in the presence of an electric field between the two electrodes 2 and 3. Thus, in the event that the current of the supply of an integrated circuit comprising the memory device is cut off, for example, the items of information contained in the memory are maintained in the memory cell.

Figure 2:
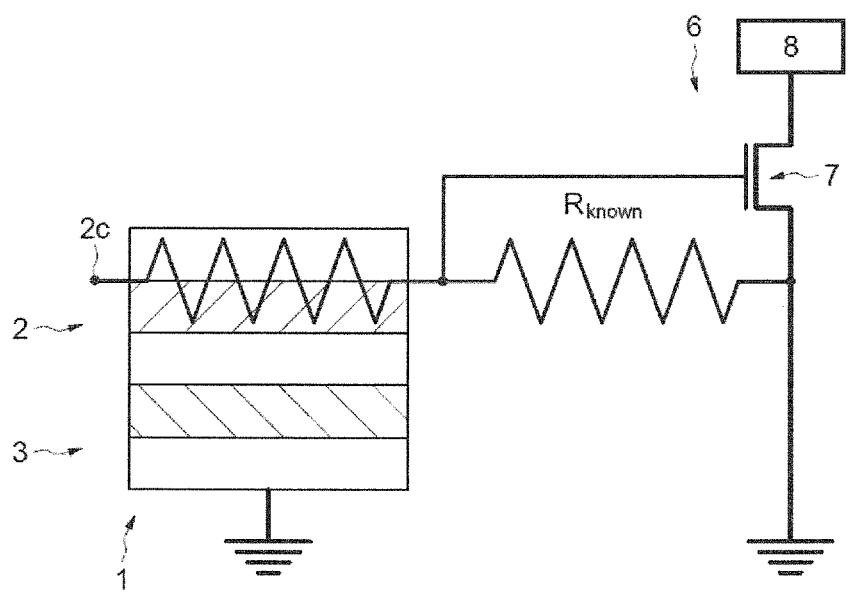
FIG. 2 is a schematic diagram of the device of FIG. 1 provided with electrical reading circuitry according to one embodiment of the present disclosure.

FIG. 2 is a schematic diagram of the device of FIG. 1 provided with electrical reading means or a circuit 6 according to one embodiment. Once the writing or erasing electric field has been stopped, the electrodes 2 and 3 of the storage means 1 of the memory cell are electrically neutral and keep their optoelectronic state, and therefore their impedance. Solid electrolyte 4 insulates the anodic and cathodic electrochromic materials 2a and 3a perfectly. Consequently, no redox reaction can take place. The memory cell therefore has a nonvolatile nature.

Electrical reading means or a circuit 6 are produced and configured in order to measure the impedance of the cathode 2. The electrical reading means 6 comprise a voltage divider arrangement having a resistor of known value, $R_{known}$, connected in series with the cathode 2, which is used as a gauge resistor, and a reading MOS transistor 7 whose gate is connected to the cathode terminal 3 coupled to the known resistor, $R_{known}$. The resistor $R_{known}$ is connected between the source and the gate of the reading transistor 7, and a calculation unit 8 is coupled to the drain of the reading MOS transistor 7. The voltage $V_{DS}$ between the terminals of the source and the drain of the reading transistor 7 is measured in order to determine the voltage $V_{GS}$ between the gate and the source of the reading transistor 7, which corresponds to the voltage across the terminals of the known resistor $R_{known}$. These two voltages are interrelated via the voltage gain $G_{voltage}$ of the MOS transistor:

$$G_{voltage} = \frac{V_{DS}}{V_{GS}} = -g_m \cdot R_D$$

where $g_m$ is the transconductance and $R_D$ is the resistance of the drain, which are known by design of the MOS transistor.

By applying a known supply voltage $V_{supp}$ between the variable electrochromic resistance, in series with the known resistor, and the source of the reading transistor 7, via the ungrounded terminal 2c of the storage means 1, a voltage divider arrangement is indeed obtained in which:

$$R_{electrochromic} = \frac{V_{supp} - V_{GS}}{V_{supp}};$$

i.e. $R_{electrochromic} = \dfrac{V_{supp} - \left[\dfrac{V_{DS}}{(-g_m \cdot R_D)}\right]}{V_{supp}}$, $V_{DS}$ being measured by the calculation unit 8, and the other variables being known by design.

The application of a known voltage between the other terminal of the cathode 3 and ground thus allows the calculation unit 8 to determine the value of the resistance of the cathode 3. The calculation unit 8 then compares the value of the resistance with a resistance threshold, and determines the high or low binary state of the memory cell.

Figure 3:
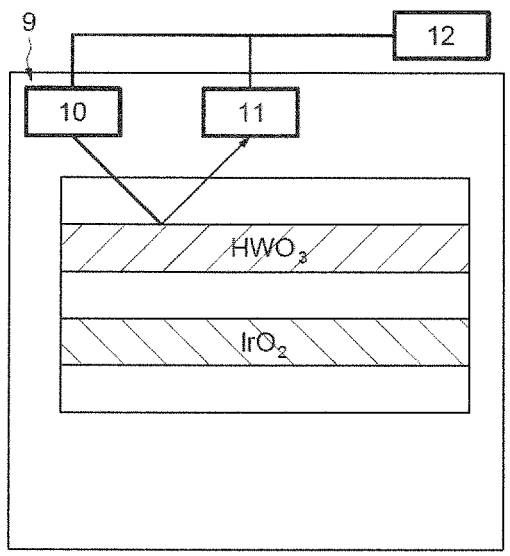
FIG. 3 is a schematic diagram of the device of FIG. 1 provided with optical reading circuitry according to a first embodiment.

FIG. 3 is a schematic diagram of the device of FIG. 1 provided with optical reading means or a circuit 9 according to a first embodiment. The optical reading means 9 are produced and configured in order to emit a light beam and measure the amount of light reflected by the storage means 1 of the memory cell. The optical reading means 9 comprise a laser diode 10 configured in order to emit an incident light beam during a reading phase, and a photodiode 11 configured in order to measure the beam intensity reflected by the storage means 1 of the memory cell, and in particular, by the layer of cathodic electrochromic material 2a.

The laser diode 10 and the photodiode 11 are arranged facing the cathode 2, so that the beam emitted by the laser diode 10 and reflected by the cathode 2 is received by the photodiode 11. The layer of conductive material 2b of the cathode comprises a layer of ITO with a thickness of between 30 and 1000 Å, so that the layer of conductive material is as transparent as possible. The optical reading means 9 comprise a reading module 12 capable of controlling the laser diode 10 and the photodiode 11 during a reading phase.

The photodiode 11 measures the amount of light reflected by the cathode 2, the amount of light reflected depending on the level of coloration, that is to say opacity, of the cathode on which the incident light beam emitted by the laser diode 10 is reflected. The measurement is transmitted to the reading module 12, which also receives the intensity of the beam emitted by the laser diode 10. The reading module 12 calculates the ratio of the intensities and compares it with a state threshold.

The low binary value state 0 is detected when the amount of light measured by the photodiode 11 is zero or low, that is to say when the ratio of the intensities which is calculated by the reading module 12 is less than the state threshold. The high binary value state 1 is detected when the amount of light measured by the photodiode 11 is nonzero or large, that is to say when the ratio of the intensities which is calculated by the reading module 12 is greater than the state threshold.

Figure 4:
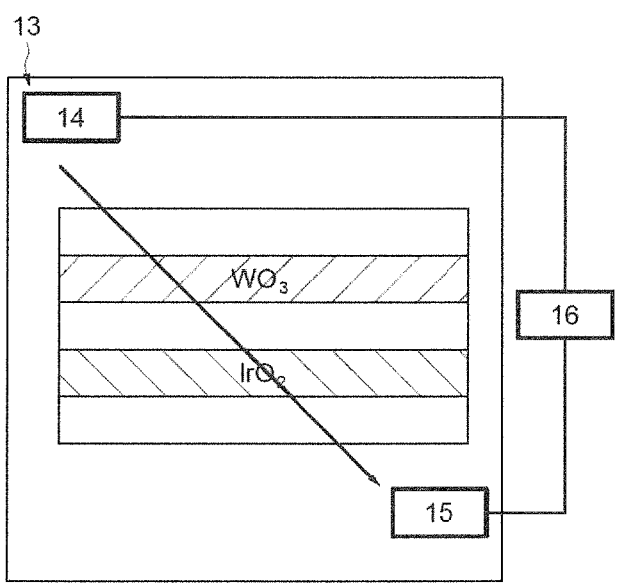
FIG. 4 is a schematic diagram of the device of FIG. 1 provided with optical reading circuitry according to a second embodiment.

FIG. 4 is a schematic diagram of the device of FIG. 1 provided with optical reading means or a circuit 13 according to a second embodiment. The optical reading means 13 are produced and configured in order to emit a light beam and measure the amount of light transmitted by the storage means 1 of the memory cell. The optical reading means 13 comprise a light-emitting diode 14 configured in order to emit a light beam during a reading phase and arranged facing the cathode 2, and a photodiode 15 configured in order to measure the beam intensity transmitted by the storage means 1 of the memory cell and arranged facing the anode 3, so that the light-emitting diode 14 and the photodiode 15 are on either side of the storage means 1 of the memory cell in relation to the stack.

The layers of conductive material 2b and 3b, respectively of the cathode and of the anode, comprise a layer of ITO with a thickness of between 30 and 1000 Å, so that each layer of conductive material is as transparent as possible. In this embodiment, the solid electrolyte 4 is configured so as to become transparent, and to this end comprises a layer of $Ta_2O_5$ hydrate having a thickness of between 30 and 2000 Å.

The optical reading means 13 comprise a reading module 16 capable of controlling the light-emitting diode 14 and the photodiode 15 during a reading phase. The photodiode 15 measures the amount of light transmitted by the storage means 1 of the memory cell, that is to say the intensity of the light beam passing fully through the storage means 1, the amount of light transmitted depending on the level of coloration, that is to say opacity, of the cathode 2 and of the anode 3 through which the incident light beam emitted by the light-emitting diode 14 passes.

The measurement is transmitted to the reading module 16, which also receives the intensity of the beam emitted by the light-emitting diode 12. The reading means 12 calculates the ratio of the intensities and compares it with another state threshold. The high binary value state 1 is detected when the amount of light measured by the photodiode 15 is zero or small, that is to say when the ratio of the intensities which is calculated by the reading module 16 is less than the state threshold. The low binary value state 0 is detected when the amount of light measured by the photodiode 15 is nonzero or large, that is to say when the ratio of the intensities which is calculated by the reading module 16 is greater than the state threshold.

Figure 5:
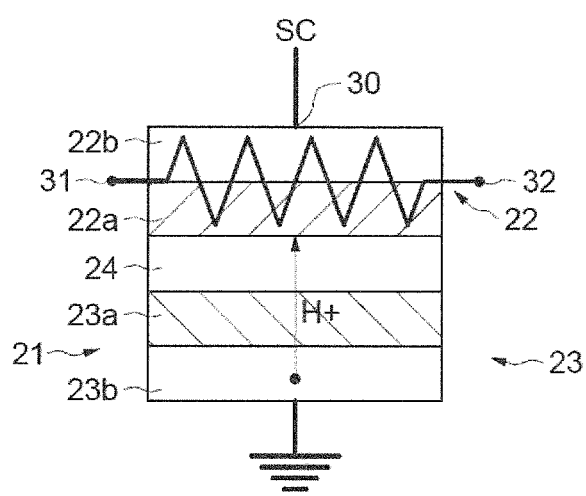
FIG. 5 is a schematic diagram of an integrated circuit comprising an optoelectronic device with variable impedance according to one embodiment.

FIG. 5 is a schematic diagram of an integrated circuit comprising an optoelectronic device with programmable variable impedance according to one embodiment. The optoelectronic device has a programmable nature in so far as the resistance can be set to one or more desired values by an intentional action.

The optoelectronic device comprises a cell 21 having a cathodic electrode 22 and an anodic electrode 23, which are configured in order to have a plurality of different optoelectronic states corresponding respectively to different impedances of the electrodes 22 and 23, a solid electrolyte 24 contained between the two electrodes 22 and 23, a control input 30 for receiving a control signal SC (voltage) intended to put the electrodes 2 and 3 in a given state by the application of an electric field, and connection terminals 31 and 32 intended to be coupled to the rest of the electrical circuit of the integrated circuit. The principle of varying the impedance of the electrodes by a redox reaction of the electrochromic layers of the electrodes, as explained above in the context of the electrochromic memory cell, may be used to produce a programmable variable impedance, in particular a programmable variable resistance. The value of the resistance of the cell 21 is controlled by the proportion of electrochromic material of the electrodes 22 and 23 which is converted from the oxidized form, having a high resistivity, to the reduced form which has a low resistivity.

The cathodic electrode 22 and the anodic electrode 23 each comprise a bilayer composed of a layer of electrochromic material, 22a and 23a respectively, and a layer of conductive material, 22b and 23b respectively. The electrolyte 24 comprises a layer of $Ta_2O_3$ hydrate having a thickness of between 30 Å and 2000 Å.

The invention claimed is:

1. A memory device comprising:
    an access transistor; and
    at least one memory cell coupled to said access transistor and configured to store an item of information, said at least one memory cell comprising
        first and second electrodes having a plurality of different optoelectronic states corresponding respectively to a plurality of values of the item of information, and switching between the different optoelectronic states based upon a control signal external to said at least one memory cell, the plurality of different optoelectronic states being stable in an absence of the control signal, and
        an electrolyte between said first and second electrodes.

2. The memory device according to claim 1 wherein said first and second electrodes each comprises a bilayer having a layer of electrochromic material, and a layer of conductive material.

3. The memory device according to claim 1 wherein said first electrode comprises a bilayer having a cathodic electrochromic material; and wherein said second electrode comprises a bilayer having an anodic electrochromic material, the cathodic and anodic electrochromic materials reacting to protons H.

4. The memory device according to claim 1 wherein said electrolyte comprises a layer of $Ta_2O_5$ hydrate.

5. The memory device according to claim 4 wherein the layer of $Ta_2O_5$ hydrate has a thickness of between 30 Å and 2000 Å.

6. The memory device according to claim 1 further comprising a first circuit generating an electric field between said first and second electrodes to modify the different optoelectronic states of said first and second electrodes.

7. The memory device according to claim 1 further comprising a reading circuit measuring an impedance of at least one of said first and second electrodes.

8. The memory device according to claim 2 further comprising an optical writing circuit emitting a light beam and measure a light beam reflected by said at least one memory cell.

9. The memory device according to claim 8 wherein said layer of conductive material is transparent when exposed to the light beam.

10. The memory device according to claim 1 further comprising an optical reading circuit emitting a light beam and measure a light beam transmitted by said at least one memory cell.

11. The memory device according to claim 2 wherein said layer of conductive material and said electrolyte are transparent.

12. The memory device according to claim 9 wherein said layer of transparent conductive material comprises at least one of a metal oxide and a thin layer of metal, the layer of transparent conductive material having a thickness of between 30 Å and 1000 Å.

13. An integrated circuit comprising:
    at least one memory cell configured to store an item of information and comprising
        first and second electrodes having a plurality of different optoelectronic states corresponding respectively to a plurality of values of the item of information, and switching between the different optoelectronic states based upon a control signal, the plurality of different optoelectronic states being stable in an absence of the control signal, and
        an electrolyte between said first and second electrodes.

14. The integrated circuit according to claim 13 wherein said first and second electrodes each comprises a bilayer having a layer of electrochromic material, and a layer of conductive material.

15. The integrated circuit according to claim 13 wherein said first electrode comprises a bilayer having a cathodic electrochromic material; and wherein said second electrode comprises a bilayer having an anodic electrochromic material, the cathodic and anodic electrochromic materials reacting to protons H$^+$.

16. The integrated circuit according to claim 13 wherein said electrolyte comprises a layer of $Ta_2O_5$ hydrate.

17. A method of making an integrated circuit comprising:
    forming a memory device to store an item of information and to comprise first and second electrodes to have a plurality of different optoelectronic states corresponding respectively to a plurality of values of the item of information, and switching between the different optoelectronic states based upon a control signal, the plurality of different optoelectronic states being stable in an absence of the control signal; and
    forming an electrolyte between the first and second electrodes.

18. The method according to claim 17 wherein the first and second electrodes each comprises a bilayer having a layer of electrochromic material, and a layer of conductive material.

19. The method according to claim 17 wherein the first electrode comprises a bilayer having a cathodic electrochromic material; and wherein the second electrode comprises a bilayer having an anodic electrochromic material, the cathodic and anodic electrochromic materials reacting to protons H+.

20. The method according to claim 17 wherein the electrolyte comprises a layer of $Ta_2O_5$ hydrate.

21. A memory device comprising:
    an access transistor; and
    at least one memory cell coupled to said access transistor and configured to store an item of information, said at least one memory cell comprising
        first and second electrodes having a plurality of different optoelectronic states corresponding respectively to a plurality of values of the item of information, and switching between the different optoelectronic states based upon a control signal external to said at least one memory cell, the plurality of different optoelectronic states being stable in an absence of the control signal, and an electrolyte between said first and second electrodes;

said first electrode comprising $WO_3$ in a first different optoelectronic state from the plurality thereof and $H_xWO_3$ in a second different optoelectronic state from the plurality thereof;

said second electrode comprising $H_xIrO_2$ in the first different optoelectronic state and $IrO_2$ in the second different optoelectronic state.

22. The memory device according to claim 21 wherein said first and second electrodes each comprises a bilayer having a layer of electrochromic material, and a layer of conductive material.

23. The memory device according to claim 21 wherein said first electrode comprises a bilayer having a cathodic electrochromic material; and wherein said second electrode comprises a bilayer having an anodic electrochromic material, the cathodic and anodic electrochromic materials reacting to protons H+.

24. The memory device according to claim 21 wherein said electrolyte comprises a layer of $Ta_2O_5$ hydrate.

25. The memory device according to claim 21 further comprising a first circuit generating an electric field between said first and second electrodes to modify the different optoelectronic states of said first and second electrodes.

26. An integrated circuit comprising:

at least one memory cell configured to store an item of information and comprising first and second electrodes having a plurality of different optoelectronic states corresponding respectively to a plurality of values of the item of information, and switching between the different optoelectronic states based upon a control signal, the plurality of different optoelectronic states being stable in an absence of the control signal, and an electrolyte between said first and second electrodes;

said first electrode comprising $WO_3$ in a first different optoelectronic state from the plurality thereof and $H_xWO_3$ in a second different optoelectronic state from the plurality thereof;

said second electrode comprising $H_xIrO_2$ in the first different optoelectronic state and $IrO_2$ in the second different optoelectronic state.

27. The integrated circuit according to claim 26 wherein said first and second electrodes each comprises a bilayer having a layer of electrochromic material, and a layer of conductive material.

28. The integrated circuit according to claim 26 wherein said first electrode comprises a bilayer having a cathodic electrochromic material; and wherein said second electrode comprises a bilayer having an anodic electrochromic material, the cathodic and anodic electrochromic materials reacting to protons H+.

29. The integrated circuit according to claim 26 wherein said electrolyte comprises a layer of Ta2O5 hydrate.

* * * * *